US007063986B2

(12) United States Patent
Lee et al.

(10) Patent No.: US 7,063,986 B2
(45) Date of Patent: Jun. 20, 2006

(54) ROOM TEMPERATURE FERROMAGNETIC SEMICONDUCTOR GROWN BY PLASMA ENHANCED MOLECULAR BEAM EPITAXY AND FERROMAGNETIC SEMICONDUCTOR BASED DEVICE

(75) Inventors: Woo Young Lee, Seoul (KR); Suk Hee Han, Seoul (KR); Joon Yeon Chang, Seoul (KR); Hi Jung Kim, Seoul (KR); Jung Mi Lee, Seoul (KR); Jae Min Myoung, Koyang (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/910,745

(22) Filed: Aug. 3, 2004

(65) Prior Publication Data

US 2005/0045976 A1    Mar. 3, 2005

Related U.S. Application Data

(62) Division of application No. 10/342,004, filed on Jan. 14, 2003, now abandoned.

(30) Foreign Application Priority Data

Sep. 4, 2002   (KR) ................................ 2002-53306

(51) Int. Cl.
*H01L 21/302* (2006.01)
(52) U.S. Cl. ............................... 438/3; 438/34; 257/75; 365/158; 365/171
(58) Field of Classification Search ............ 438/3, 438/34; 365/158, 171, 175; 257/75, 421
See application file for complete search history.

(56) References Cited

U.S. PATENT DOCUMENTS

| | | | |
|---|---|---|---|
| 2004/0072425 A1* | 4/2004 | Cui et al. ................. | 438/689 |
| 2005/0202614 A1* | 9/2005 | Spruytte et al. ........... | 438/167 |
| 2005/0269593 A1* | 12/2005 | Chowdhury et al. ........ | 257/103 |

FOREIGN PATENT DOCUMENTS

| | | |
|---|---|---|
| JP | 11-238924 A1 | 8/1999 |
| JP | 2000-357389 A1 | 12/2000 |
| JP | 2001-148533 A1 | 5/2001 |
| JP | 2002-016010 A1 | 1/2002 |
| JP | 2002-198615 A1 | 7/2002 |
| JP | 2003-137698 A1 | 5/2003 |
| JP | 2003-528456 A1 | 9/2003 |

OTHER PUBLICATIONS

Cui et al. U.S. Appl. No. 60/364,989 filed Mar. 14, 2002.*

(Continued)

*Primary Examiner*—Thomas L. Dickey
(74) *Attorney, Agent, or Firm*—Darby & Darby

(57) ABSTRACT

A 3 group–5 group compound ferromagnetic semiconductor, comprising one material 'A' selected from the group of Ga, Al and In and one material 'B' selected from the group consisting of N and P, wherein one material 'C' selected from the group consisting of Mn, Mg, Co, Fe, Ni, Cr and V is doped as a material for substituting the material 'A', the compound semiconductor has a single phase as a whole. The ferromagnetic semiconductor can be fabricated by a plasma-enhance molecular beam epitaxy growing method and since it shows the ferromagnetic characteristics at a room temperature, it can be applied as various spin electron devices.

4 Claims, 12 Drawing Sheets

OTHER PUBLICATIONS

Sonoda, Saki, et al., "Properties of Ferromagnetic Ga1-xMnxN Films Grown by Ammonia-MBE", IEEE Transactions on Magnetics, Sep. 2002, vol. 38, No. 5, pp. 2859-2862.

* cited by examiner

US 7,063,986 B2

ROOM TEMPERATURE FERROMAGNETIC SEMICONDUCTOR GROWN BY PLASMA ENHANCED MOLECULAR BEAM EPITAXY AND FERROMAGNETIC SEMICONDUCTOR BASED DEVICE

BACKGROUND OF THE INVENTION

1. Field of the Invention

The present invention relates to a room temperature ferromagnetic semiconductor used for a spin electronic device having wide bandgap semiconductor characteristics and magnetic characteristics at a room temperature, its fabrication method, and a ferromagnetic semiconductor based device.

2. Description of the Background Art

A research on a GaN-based nitride semiconductor was started to fabricate a blue light emitting device in the early 1990, and currently, researches are being actively conducted on various electronic devices in addition to light emitting and light receiving devices.

In forming a triple element compound, an energy gap can be controlled from 1.9 eV to 6.2 eV, so that the nitride semiconductor is used for fabrication of a light emitting device of a wave length region of the entire visible light including an ultraviolet ray region. A blue and green light emitting diode (LED) and a ultraviolet ray detector was successfully commercialized years ago, and a blue light emitting diode (LED0 is anticipated to be commercialized soon.

Meanwhile, research on an electronic device using the nitride semiconductor is actively ongoing. Since a report on a research on a GaN MESFET (metal-semiconductor field effect transistor), a crystal growing technique has been much developed and an electronic device fabrication technique has been also remarkably improved. Diverse researches are being conducted on the electronic device on the basis of excellent physical properties such as a large energy gap, a high thermal and chemical stability, a high electron mobility, a high breakdown voltage and saturation electron speed, the large discontinuation of conduction band, or the like.

Meanwhile, in view of a novel conceptual spintronics (a compound word of spin and electronics, a fresh paradigm intending to develop an electron and an optical device in consideration of freedom of a spin together with the electronic charge of the electron, a research has been ongoing on the applicability of spintronics in the wake of report on ferromagnetic semiconductor characteristics at a temperature of about 110 K by substituting a portion of Ga in GaAs with Mn, a transition metal, by using a molecular beam epitaxy (MBE) process in the late 1990.

In this respect, however, (In,Mn)As (Tc=35K), (Ga,Mn)As (Tc=110K) and MnGe (Tc=116 K) are representative ferromagnetic semiconductors which have been studied up to date, but owing to the low Curie temperature, there is a limitation in fabricating a spin device that can be operated at a room temperature. Therefore, finding a ferromagnetic semiconductor with a Curie temperature above a room temperature is the most critical factor in this field.

According to a theoretical computation result using a Zener model, GaN, ZnO are anticipated to exhibit a Curie temperature above the room temperature, on which, thus, researches are being focussed to testify experimentally.

SUMMARY OF THE INVENTION

Therefore, an object of the present invention is to provide a semiconductor with magnetic characteristics at a room temperature and its fabrication method.

Another object of the present invention is to provide various spin electronic devices using the room temperature ferromagnetic semiconductor.

To achieve these and other advantages and in accordance with the purpose of the present invention, as embodied and broadly described herein, there is provided a ferromagnetic semiconductor, a 3 group–5 group compound semiconductor comprising one material 'A' selected from the group of Ga, Al and In and one material 'B' selected from the group consisting of N and P, in which one material 'C' selected from the group consisting of Mn, Mg, Co, Fe, Ni, Cr and V is doped as a material for substituting the material 'A', the compound semiconductor has a single phase on the whole.

To achieve the above objects, there is further provided a method for fabricating a ferromagnetic semiconductor including the steps of: forming a 3 group–5 group compound semiconductor thin film comprising one material 'A'selected from the group consisting of Ga, Al and In and one material 'B' selected from the group consisting of N and P; and doping one material 'C' selected from the group consisting of Mn, Mg, Co, Fe, Ni, Cr and V as a material for substituting the material 'A', whiling forming the compound semiconductor thin film by a plasma-enhanced molecular beam epitaxy, wherein the materials 'A' and 'C' are supplied by thermally evaporating from an effusion cell and the material 'B' is supplied from a plasma source.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

As one embodiment of the present invention, a Mn- or Mg-doped GaN thin film was grown by using a plasma-enhanced molecular beam epitaxy device, for which an undoped GaN (GaN templete) grown on a surface of sapphire (0001) by using a metal organic chemical vapor deposition (MOCVD) device was used as a substrate.

Figure 1:
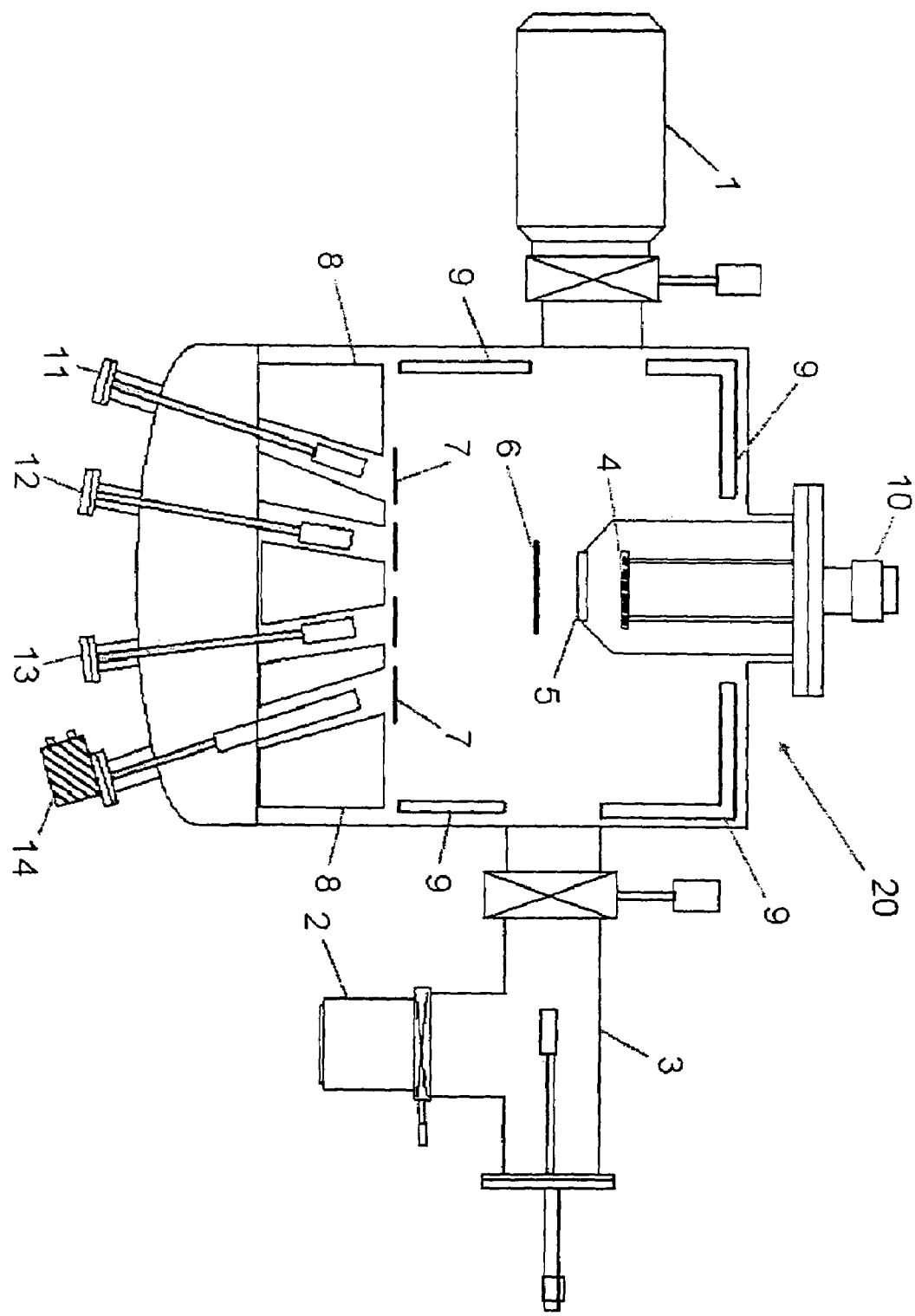
FIG. 1 is a schematic view showing a plasma enhanced molecular beam epitaxy (PEMBE) used in the present invention.

FIG. 1 is a schematic view showing the plasma-enhanced molecular beam epitaxy device used in the present invention.

Turbomolecular pumps 1 and 2 are connected at the right side and left side of a chamber 20, and a substrate 5 is positioned at an upper portion of the chamber 20. The substrate is controlled in its position by a substrate manipulator 10 formed at an upper portion of the chamber. A heater 4 is positioned at an upper side of the substrate to control a temperature of the substrate. A liquefied nitrogen ($LN_2$) supply unit 8 is positioned at a lower portion inside the chamber and $LN_2$ covers 9 are attached inside the chamber. Reference numerals 6 and 7 denote, respectively, shutters and 3 denotes a load-lock chamber.

The plasma-enhanced molecular beam epitaxy device is an ultra high vacuum (UHV) system which has a base pressure of $1.2 \times 10^{-9}$ torr and exhibits vacuum of about $2 \times 10^{-10}$ when $LN_2$ is supplied thereto. The rotational substrate manipulator can handle a substrate with a diameter of 3". There are 8 ports at the bottom flange so that effusion cells 11, 12 and 13 for thermally evaporating a requested chemical element can be mounted thereto. The effusion cells are connected to a matching box together with an RF plasma source 14.

Ga with a purity of 99.99999% (7N) was used to grow the GaN thin film, and Mn (6N) and Mg (6N) were used for doping. $N_2$ (7N) gas was supplied through the RF plasma source. A high purity refractory material, for example, PbN, Mo or the like, was used inside the plasma source to prevent contamination by the high temperature plasma, to which cooling water flew. During the growth of Mn-doped GaN thin film, the temperature of the substrate was 750~1000° C., the Mn effusion cell temperature was 600~800° C., plasma power was 250~350 W, $N_2$ flow rate was 1.5~2 sccm.

Hall-measuring of the thusly fabricated (Ga,Mn)N thin film by Van der Pauw method showed that it has characteristics of an n-type semiconductor, its carrier concentration was n=$10^{16}$–$10^{17}$/cm$^3$, its electron mobility ($\mu_H$) was about $10^3$ cm$^2$/Vs, and its non-resistance ($\rho$) was 0.2 Ω cm.

When Mg was doped in a basic experiment to grow a p-type ferromagnetic semiconductor, the electron concentration was rapidly reduced from ~$2.9 \times 10^{19}$ cm$^{-3}$ to ~$4.8 \times 10^{17}$ cm$^{-3}$ as FGa/FN flux ratio was increased. It is believed that this is because a compensation effect is increased due to the increase in the Mg concentration according to the increase in the flux ratio. Therefore, it is noted that an Mg-doped GaN thin film of p-type conductance can be grown and p-type ferromagnetic semiconductor can be grown by simultaneously doping Mn and Mg.

Figure 2:
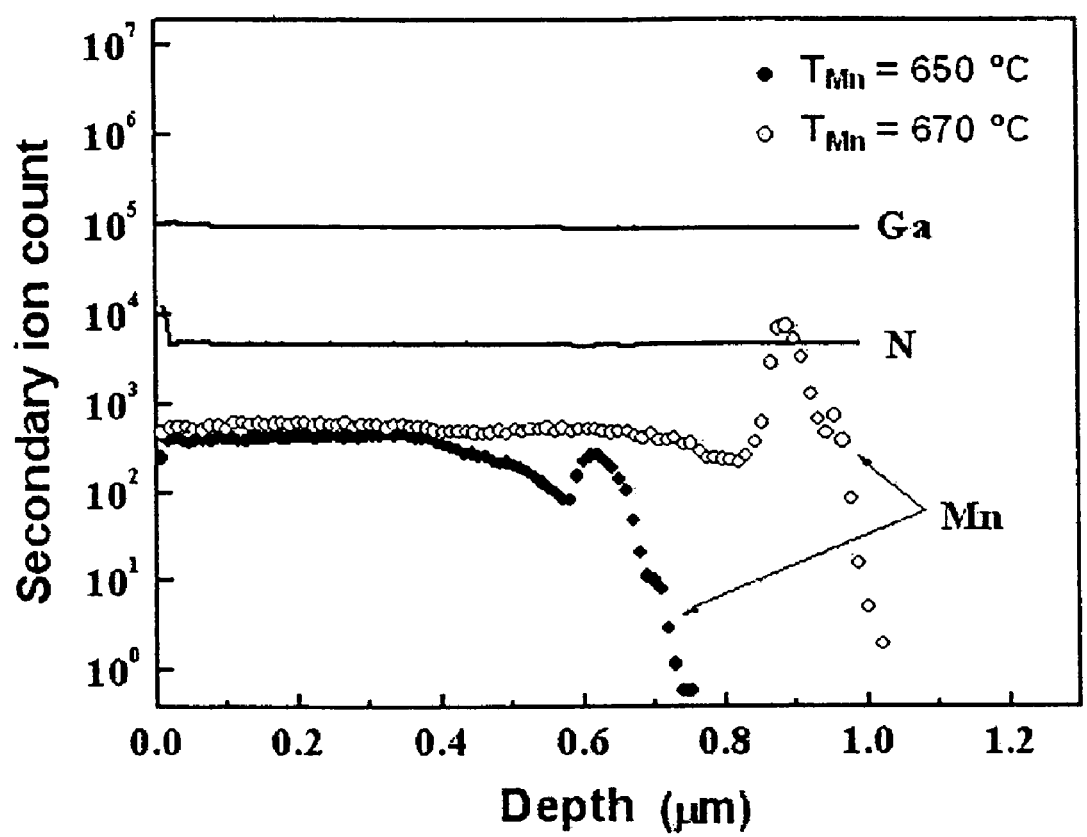
FIG. 2 is a graph showing a result of a secondary ion mass spectroscopy (SIMS) measured to observe a Mn distribution in a thin film according to a Mn cell temperature of a (Ga,Mn)N thin film fabricated by the PEMBE method in accordance with the present invention.

FIG. 2 is a graph showing a result of secondary ion mass spectroscopy (SIMS) measured to observe a Mn distribution in a thin film according to a Mn cell temperature of the (Ga,Mn)N thin film.

As shown in FIG. 2, it is noted that Mn in the thin film has an even distribution in the range of 0.7~1.0 μm. In Addition, it is noted that the Mn concentration in the GaN thin film is increased as the Mn cell temperature goes up. Without a basic sample with an information of Mn concentration, it is not possible to know an accurate Mn concentration for each sample. But from the SIMS result, it can be noted that Mn is effectively doped when GaN is grown. Mn concentration of each sample was indicated as obtained from a magnetic moment measured for each sample. The concentration of the doping material affects a physical property of a magnetization value, and a suitable Mn concentration for growing a single-phase ferromagnetic semiconductor was 0.06~3%.

Figure 3:
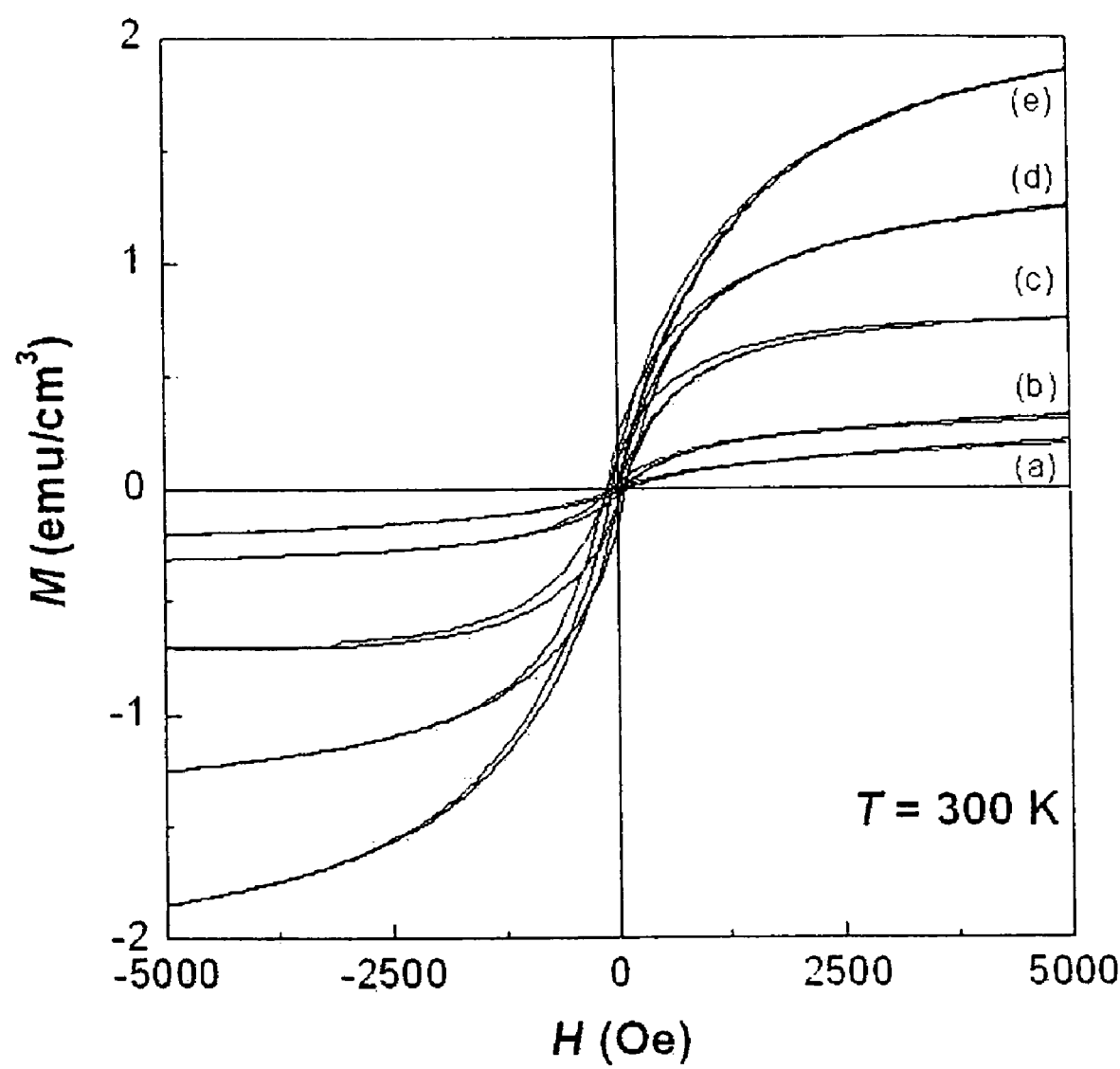
FIG. 3 is a graph showing a room temperature hysteresis loop of a (Ga,Mn)N thin film fabricated according to a change in the Mn cell temperature and plasma power in the PEMBE method in accordance with the present invention.

FIG. 3 shows a hysteresis loop of the (Ga,Mn)N thin film fabricated according to a change in a Mn cell temperature and plasma power as measured at a room temperature with high-sensitivity ($10^{-8}$ emu) AGM (alternating gradient magnetometer). The Mn cell and plasma power in this context are (a) 630° C./350 W, (b) 650° C./350 W, (c) 650° C./250 W, (d) 650° C./400 W, and (e) 670° C./350 W, respectively.

It can be observed from the hysteresis loop that the (Ga,Mn)N fabricated in accordance with the present invention have the typical magnetic characteristics at a room temperature.

In case that the plasma power is 350 W and the Mn cell temperature goes up to 670° C. from 630° C., the magnetization value is sharply increased. That is, as the Mn cell temperature is increased, the Mn concentration is increased.

Meanwhile, in case that the Mn cell temperature is 650° C. and the plasma power is changed in the range of 250~350, the magnetization value is little changed.

As the greatest magnetization value, (Ga,Mn)N fabricated with the Mn cell temperature of 670° C. and plasma power of 350 W has that Ms=1.0 emu/cm$^3$ and 0.5% Mn concentration.

That is, the magnetization value can be more increased by increasing the concentration of Mn. The temperature of the effusion cell has a great influence on the physical property of the ferromagnetic semiconductor, and an optimum temperature is set depending on a doped material.

Figure 4:
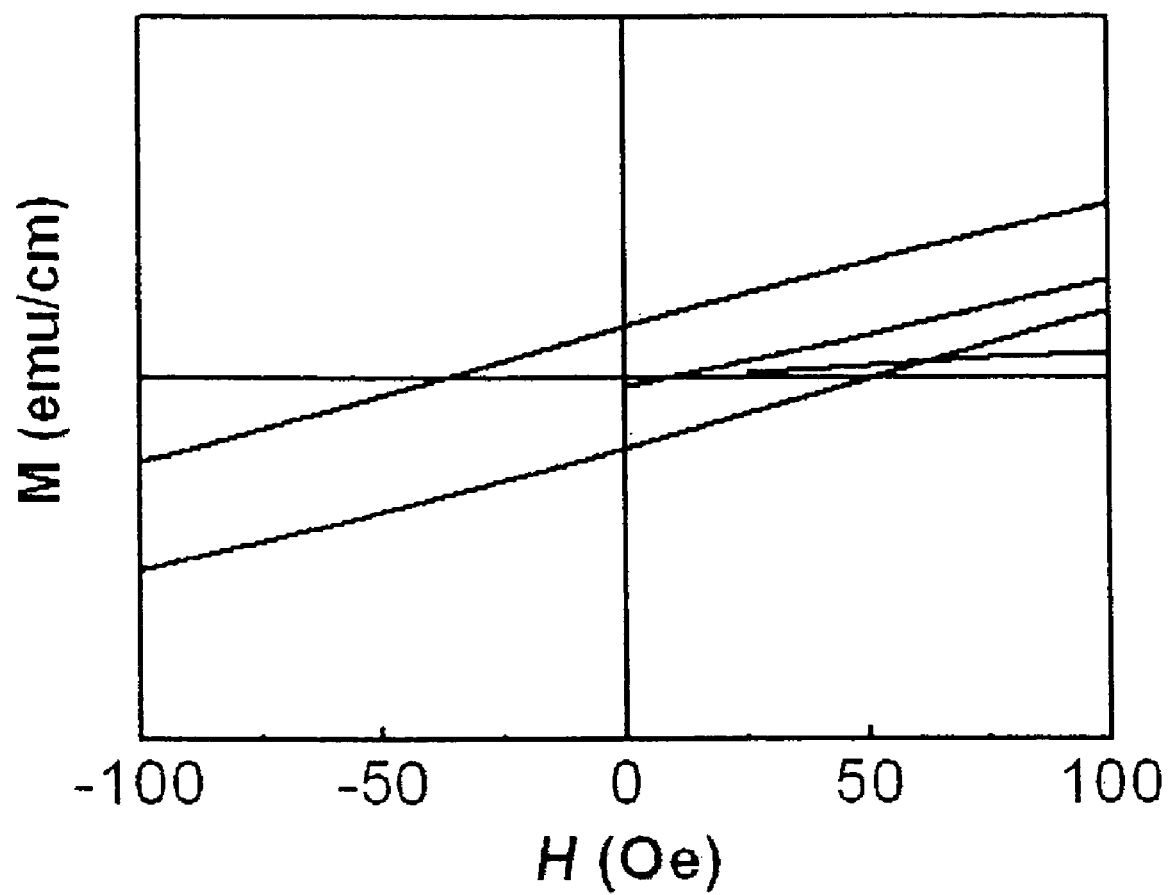
FIG. 4 is a graph showing a hysteresis loop of a (Ga,Mn)N thin fim fabricated under the condition of 670° C./350 W by the PEMBE method in accordance with the present invention.

FIG. 4 is graph showing an enlarged hysteresis loop of the (Ga,Mn)N thin film fabricated under the condition of 670° C./350 W. As illustrated, a coercive force ($H_c$)=69.0 e. If there exists a secondary phase such as nano-cluster showing magnetic characteristics in the (Ga,Mn)N thin film, since it exhibits a superparamagnetic behavior, a coercive force can not be expected.

Therefore, the result of FIG. 4 reflects (Ga,Mn)N has a single phase formed by substituting Ga with Mn and this single phase has the magnetic characteristics at the room temperature.

Figure 5:
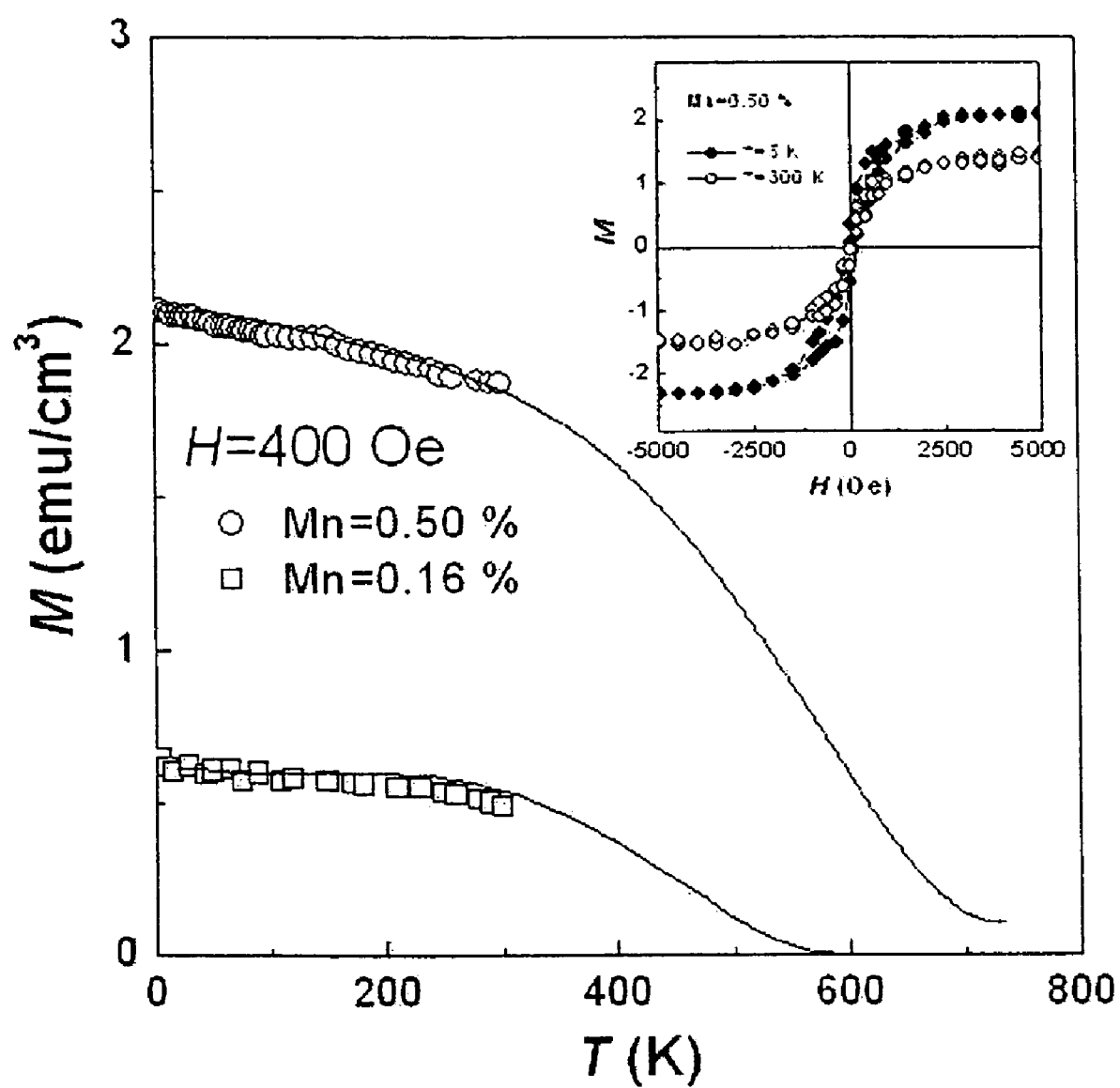
FIG. 5 is a graph showing a temperature dependency of magnetization of a (Ga,Mn) N thin film with a Mn concentration of 0.16% and 0.50% fabricated by the PEMBE method.

FIG. 5 is a graph showing a temperature dependency of magnetization of (Ga,Mn)N thin films, respectively, with Mn concentration of 0.16% and 0.50%. The two thin films all show a typical ferromagnetization in 4–300K. According to a computation result by using a mean field theory in order to predict a Curie temperature, each Curie temperature (Tc) shows about 550K and 700 K for (Ga,Mn)N thin films respectively with the Mn concentration of 0.16% and 0.50%. This result tells that a spin device fabricated by using the ferromagnetic (Ga,Mn)N thin film has an enough thermal stability. The picture inserted into a right upper end of FIG. 5 shows hysteresis loop that (Ga,Mn)N thin film with an Mn concentration of 0.50% was measured in 4K and 300K.

Figure 6:
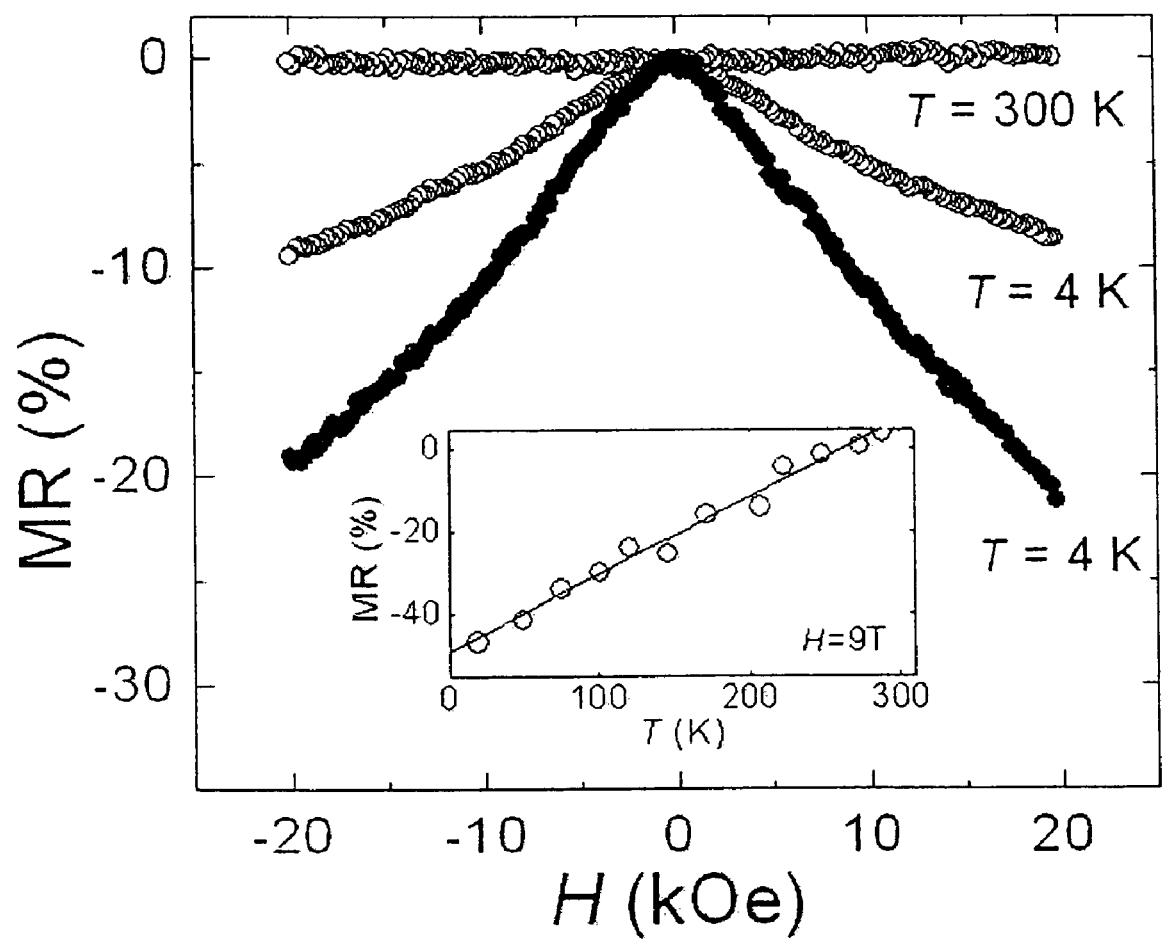
FIG. 6 is a graph showing a change of a magnetic resistance according to magnetic field perpendicular to the thin film for a (Ga,Mn)N thin film fabricated when plasma power is 250 W and Mn cell temperatures are 600° C. (○) and 650° C. (●) in the PEMBE method.

FIG. 6 shows a magnetoresistance change according to magnetic fields perpendicular to (Ga,Mn)N thin film fabricated when plasma power was 250 W and Mn cell temperatures were 660° C. (○) and 650° C. (●). The (Ga,Mn)N thin film fabricated under the two conditions exhibits little resistance change according to the magnetic fields in 300K but exhibits a negative magnetoresistance of $\Delta R/R=10\%$ and $\Delta R/R=20\%$ in 4K when 20 kOe magnetic field is applied thereto.

The picture inserted at the central lower end of FIG. 6 shows that the negative magnetoresistance changes according to a temperature in 4~300K.

The negative magnetoresistance is representative characteristics of the ferromagnetic semiconductor, which is much similar to the result of the known (Ga,MN)As (Tc=110K). With this fact, (Ga,Mn)N fabricated in accordance with the present invention is the semiconductor having the magnetic characteristics at the room temperature. The cause of the negative magnetoresistance is not known yet but widely believed that it is because that a magnetic polaron is formed made up of a carrier and an electron cloud of the Mn spin or because of a Zeeman shift of permi energy.

Figure 7:
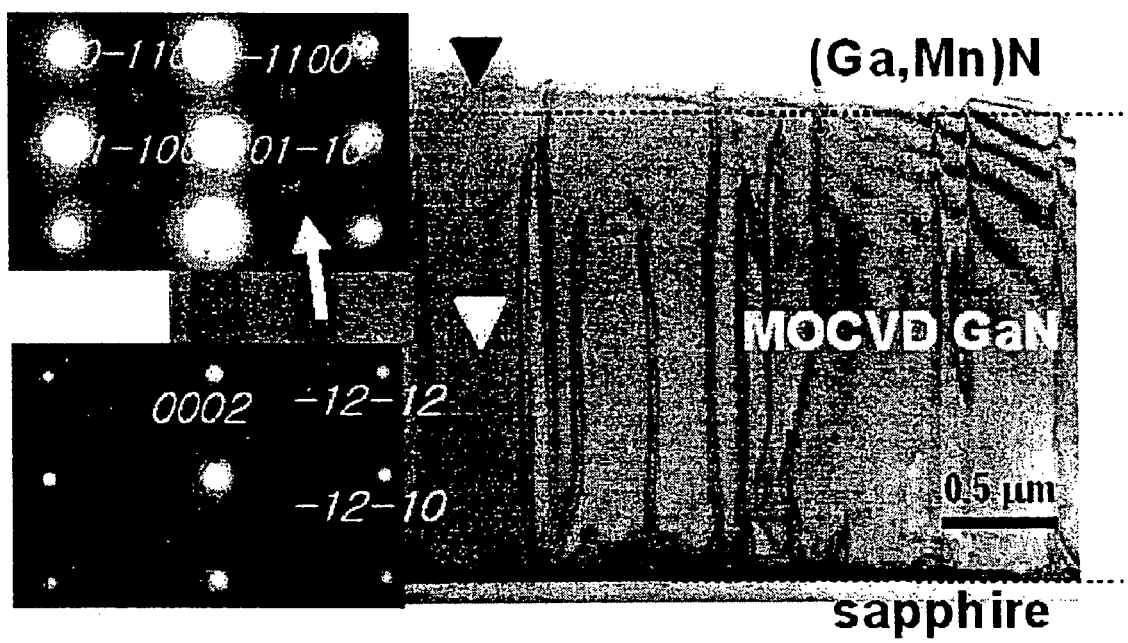
FIG. 7 is a photograph showing a sectional view of a transmission electron microscope (TEM) and an electron diffraction pattern for a (Ga,Mn)N thin film with a Mn concentration of 0.2% fabricated by the PEMBE method in accordance with the present invention.

FIG. 7 is a photograph showing a section of the TEM for the (Ga,Mn)N thin film with an Mn concentration of 0.2%.

As shown, GaN with a thickness of 2 μm grown on a sapphire substrate by the MOCVD method and (Ga,Mn)N grown thereon by the PEMBE method.

As noted from the electron diffraction pattern inserted to the left portion of FIG. 6, there is observed (0-110), (-1100), (1-100), (01-10) additional diffraction spot which are not observed in GaN grown by the MOCVD method.

This is a phenomenon occurring as Ga is substituted with Mn in the (Ga,Mn)N thin film corresponding to a wurtzite structure among hexagonal structures, showing that Mn shows a single (Ga,Mn)N phase by effectively substituting Ga without forming a secondary phase. Meanwhile, according to the observation result of the TEM, the secondary phase such as the nano cluster was not observed.

Figure 8:
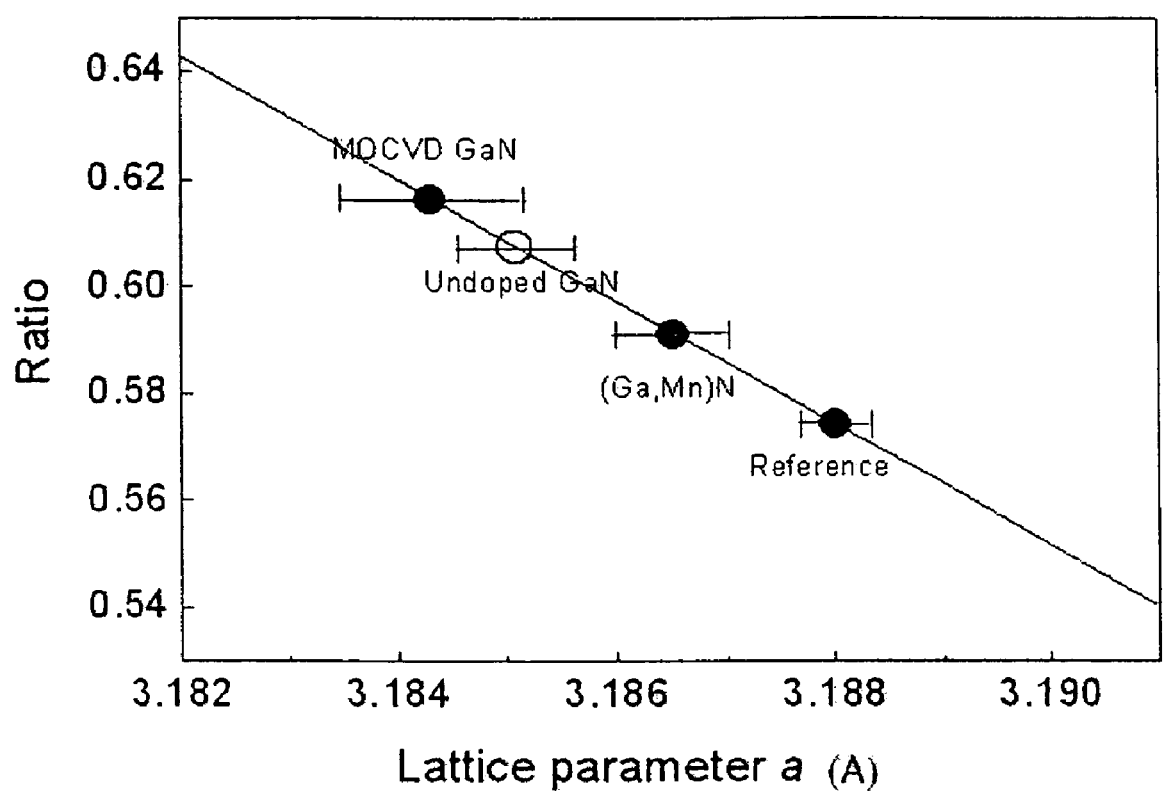
FIG. 8 is a graph showing a lattice constant a measured by a high-order Laue zone (HOLZ) method for a ferromagnetic semiconductor fabricated by the PEMBE method in accordance with the present invention.

FIG. 8 is a graph showing lattice constants (a) of several samples measured by a high-order Laue zone (HOLZ) method. A standard sample of them is GaN with a thickness of 200 μm fabricated by hydride vapor phase epitaxy (HVPE) method and has no lattice mismatch by sapphire. As shown, comparison between the lattice constants of (Ga, Mn)N and GaN grown by the PEMBE method shows that (Ga,Mn)N is greater than Ga. With this fact, it is confirmed that (Ga,Mn)N is a single (Ga,Mn)N phase formed by substituting Ga with Mn.

Meanwhile, as well as Mn, a ferromagnetic semiconductor can be grown by doping a suitable amount of Co, Fe and Ni, the typical ferromagnetic transition element, and Cr, V or the like which has a similar quality to Mn.

The ferromagnetic semiconductor fabricated in accordance with the present invention can be applicable to various devices.

Figure 9:
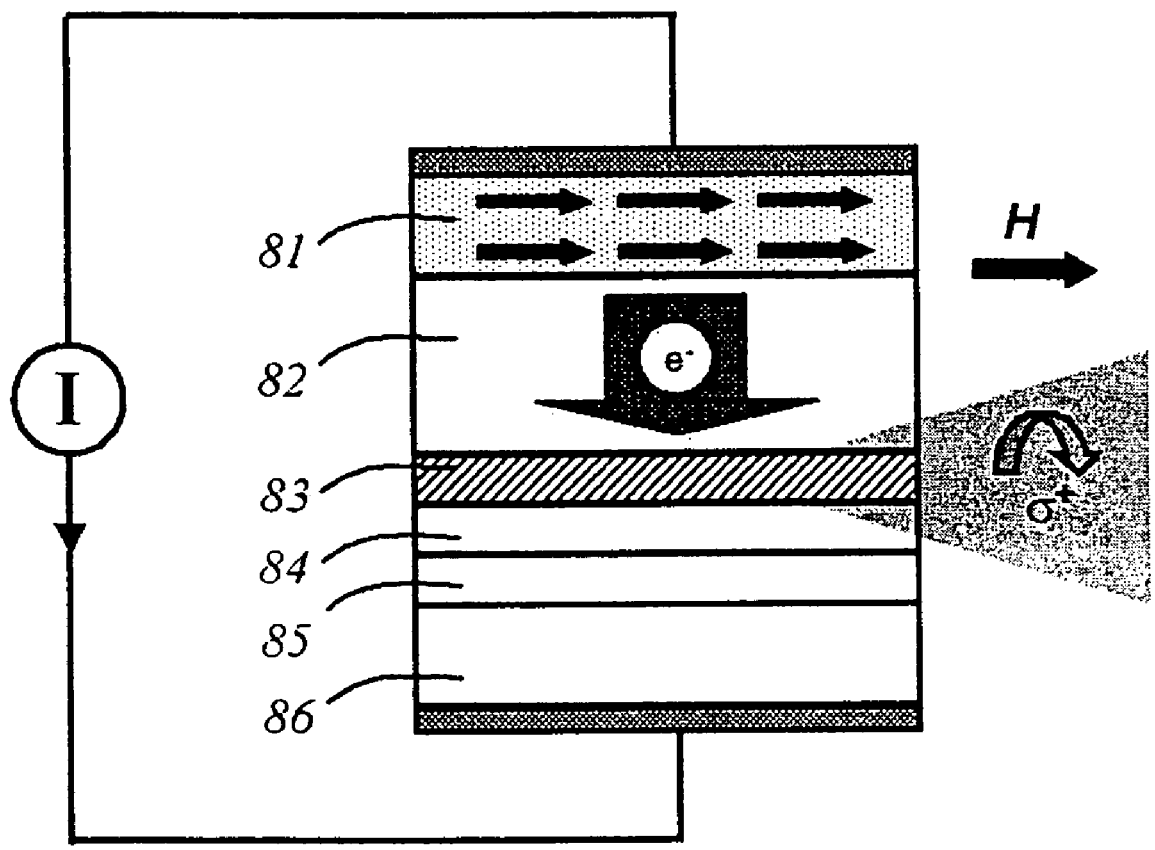
FIG. 9 is a sectional view showing a structure of a spin LED using a ferromagnetic semiconductor fabricated by the PEMBE method in accordance with the present invention.

FIG. 9 is a sectional view showing a structure of a spin LED using a ferromagnetic semiconductor fabricated by the PEMBE method in accordance with the present invention.

As shown in FIG. 9, on an n-type (or p-type) ferromagnetic semiconductor 81, there are sequentially formed a spacer 82, an insulation layers 83 and 84, a p-type (or n-type) buffer 85, a p-type (or n-type) substrate 86.

Figure 10:
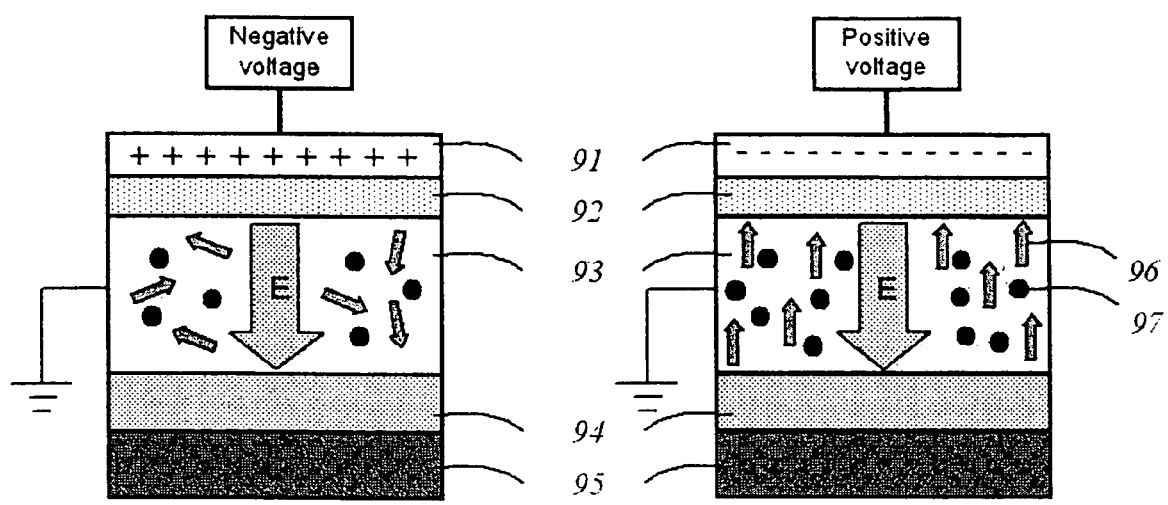
FIG. 10 is a sectional view showing a structure of a Hall effect memory device using the ferromagnetic semiconductor fabricated by the PEMBE method in accordance with the present invention.

In addition, as shown in FIG. 10, as for the ferromagnetic semiconductor fabricated in accordance with the present invention, a ferromagnetic semiconductor 93 can be changed to have a ferromagnetic property or to have a non-ferromagnetic property by controlling a carrier concentration with a voltage of a gate 91 so as to be applicable as a Hall effect memory device by using the properties that a Hall resistance is big from an extraordinary Hall effect when the ferromagnetic semiconductor has the ferromagnetic property, while the Hall resistance is small from an ordinary Hall effect when the ferromagnetic semiconductor has the non-ferromagnetic property. In FIG. 10, reference numerals 92 and 94 denote insulation layers, 95 denotes a buffer layer, 96 denotes a spin of a material doped in the ferromagnetic semiconductor, and 97 denotes an electron (or Hole).

Figure 11:
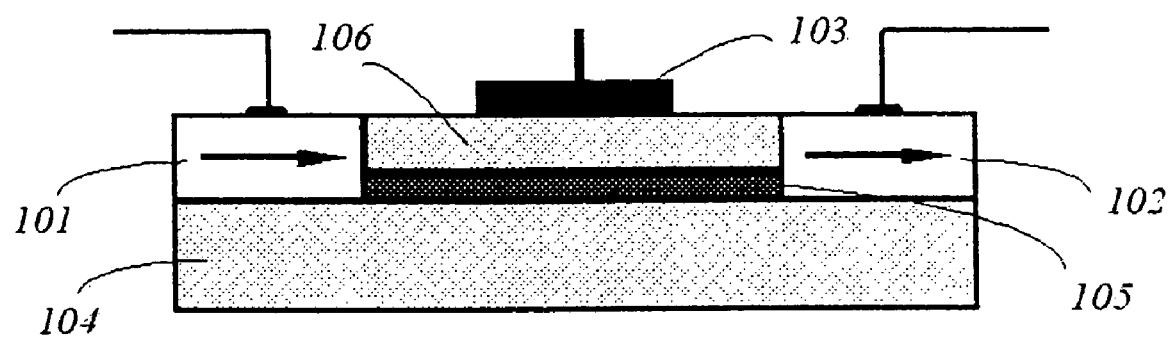
FIG. 11 is a sectional view showing a structure of a spin-polarized field effect transistor (spin FET)) using the ferromagnetic semiconductor fabricated by the PEMBE method in accordance with the present invention.

Moreover, as shown in FIG. 11, the ferromagnetic semiconductor fabricated in accordance with the present invention can be applicable as a spin-polarized field effect transistor (spin FET) by injecting a spin-polarized carrier into a two dimensional electron gas 105 by using a source 101 and a drain 102 of a spin transistor and by using a change in a resistance according to an external magnetic field or controlling a procession of the spin-polarized carrier with a voltage of the gate 103.

Reference numerals 104 and 106 denote a barrier layer (insulation layer) of a quantum well structure.

Figure 12:
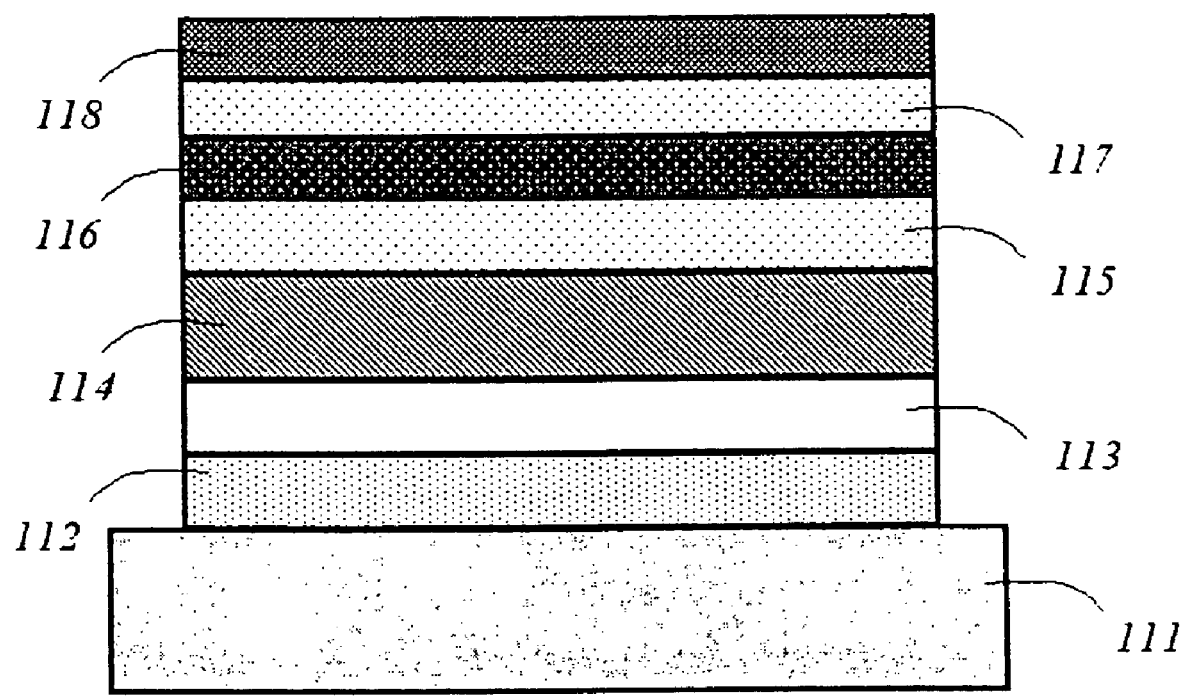
FIG. 12 is a sectional view showing a magnetic tunnelling junction device with a structure of ferromagnetic semiconductor/insulating material/ferromagnetic semiconductor using the ferromagnetic semiconductor fabricated by the PEMBE method in accordance with the present invention.

Furthermore, as shown in FIG. 12, the ferromagnetic semiconductor fabricated in accordance with the present invention can be applicable to a magnetic tunnelling junction with a structure of ferromagnetic semiconductor/insulation material/ferromagnetic semiconductor.

Reference numeral 111 denotes a substrate, 112 denotes a buffer, 113 denotes a seed layer, 114 denotes an anti-ferromagnetic layer, 115 and 117 denote ferromagnetic semiconductor, 116 denotes a tunnel barrier (insulation layer), and 118 denotes a capping layer.

As so far described, unlike the conventional art where the ferromagnetic semiconductor shows characteristics only at a low temperature, the ferromagnetic semiconductor of the present invention implements the ferromagnetic characteristics even at the room temperature. Therefore, the ferromagnetic semiconductor of the present invention can be adopted to various spin electron devices as a novel ferromagnetic semiconductor implementing a spintronix.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a ferromagnetic semiconductor comprising the steps of:
    forming a 3 group–5 group compound semiconductor thin film comprising one material 'A' selected from the group consisting of Ga, Al and In and one material 'B' selected from the group consisting of N and P on a substrate; and
    doping one material 'C' selected from the group consisting of Mn, Mg, Co, Fe, Ni, Cr and V as a material for substituting the material 'A', while forming the compound semiconductor thin film by a plasma-enhanced molecular beam epitaxy,
    wherein the materials 'A' and 'C' are supplied from an effusion cell and the material 'B' is supplied from a plasma source, and wherein the plasma power is 250~350 W.

2. The method of claim 1, wherein the temperature of the effusion cell is 600~800°.

3. The method of claim 1, wherein the doping concentration is in the range of 0.06~3%.

4. The method of claim 1, wherein the temperature of the substrate is in the range of 300~1000° C.

* * * * *